United States Patent
Mazzochette et al.

(10) Patent No.: US 7,183,640 B2
(45) Date of Patent: Feb. 27, 2007

(54) METHOD AND STRUCTURES FOR ENHANCED TEMPERATURE CONTROL OF HIGH POWER COMPONENTS ON MULTILAYER LTCC AND LTCC-M BOARDS

(75) Inventors: Joseph Mazzochette, Cherry Hill, NJ (US); Ellen Schwartz Tormey, Princeton Junction, NJ (US); Barry Jay Thaler, Lawrenceville, NJ (US)

(73) Assignee: Lamina Ceramics, Inc., Westampton, NJ (US)

( * ) Notice: Subject to any disclaimer, the term of this patent is extended or adjusted under 35 U.S.C. 154(b) by 0 days.

(21) Appl. No.: 10/702,957

(22) Filed: Nov. 6, 2003

(65) Prior Publication Data

US 2004/0124002 A1 Jul. 1, 2004

Related U.S. Application Data

(63) Continuation-in-part of application No. 10/199,418, filed on Jul. 19, 2002, now Pat. No. 6,713,862, which is a continuation-in-part of application No. 09/664,599, filed on Sep. 18, 2000, now Pat. No. 6,455,930.

(60) Provisional application No. 60/425,599, filed on Nov. 12, 2002, provisional application No. 60/170,417, filed on Dec. 13, 1999, provisional application No. 60/213,098, filed on Jun. 21, 2000, provisional application No. 60/206,519, filed on May 22, 2000, provisional application No. 60/206,170, filed on May 22, 2000.

(51) Int. Cl.
 *H01L 23/10* (2006.01)
(52) U.S. Cl. .............................. 257/703; 257/706
(58) Field of Classification Search ................. None
 See application file for complete search history.

(56) References Cited

U.S. PATENT DOCUMENTS

| | | | |
|---|---|---|---|
| 4,615,031 A | 9/1986 | Eales et al. | 372/36 |
| 4,748,085 A | 5/1988 | Fukuda et al. | 428/432 |
| 4,821,151 A | 4/1989 | Pryor et al. | 361/403 |
| 5,237,434 A | 8/1993 | Feldman et al. | 359/19 |
| 5,256,469 A | 10/1993 | Cherukuri et al. | 428/210 |
| 5,386,339 A | 1/1995 | Polinski, Sr. | 361/719 |
| 5,565,262 A | 10/1996 | Azzaro et al. | 428/210 |
| 5,581,876 A | 12/1996 | Prabhu et al. | 29/851 |
| 5,604,673 A * | 2/1997 | Washburn et al. | 363/147 |
| 5,615,224 A | 3/1997 | Cohen | 372/36 |
| 5,638,391 A | 6/1997 | Shima et al. | 372/44 |
| 5,725,808 A | 3/1998 | Tormey et al. | 252/514 |

(Continued)

FOREIGN PATENT DOCUMENTS

JP 6-244307 2/1994

*Primary Examiner*—Chandra Chaudhari
(74) *Attorney, Agent, or Firm*—Lowenstein Sandler PC

(57) ABSTRACT

A multilayer ceramic circuit board comprises a core of high conductivity material such as metal and an overlying layer of electrically insulating ceramic having an outer surface. In accordance with the invention, a circuit board for receiving a high power component is provided with a thermal spreading layer on or near the outer surface and one or more thermal vias through the ceramic to thermally couple the spreading layer to the core. The vias and the spreading layer comprise electrically insulating thermally conductive materials. The resulting structure provides rapid heat dissipation for a high power component formed or mounted on or near the spreading layer.

8 Claims, 2 Drawing Sheets

U.S. PATENT DOCUMENTS

| | | | |
|---|---|---|---|
| 5,897,912 A * | 4/1999 | Shaikh | 427/79 |
| 5,939,778 A | 8/1999 | Boutin et al. | 257/678 |
| 5,949,654 A | 9/1999 | Fukuoka | 361/760 |
| 5,977,567 A | 11/1999 | Verdiell | 257/99 |
| 6,017,642 A | 1/2000 | Kumar et al. | 428/630 |
| 6,023,413 A | 2/2000 | Umezawa | 361/697 |
| 6,055,151 A | 4/2000 | Tormey et al. | 361/313 |
| 6,097,857 A | 8/2000 | Feldman | 385/14 |
| 6,146,025 A | 11/2000 | Abbink et al. | 385/88 |
| 6,172,416 B1 | 1/2001 | Miyahara et al. | 257/712 |
| 6,323,549 B1 * | 11/2001 | deRochemont et al. | 257/703 |

\* cited by examiner

METHOD AND STRUCTURES FOR ENHANCED TEMPERATURE CONTROL OF HIGH POWER COMPONENTS ON MULTILAYER LTCC AND LTCC-M BOARDS

CROSS-REFERENCE TO RELATED APPLICATIONS

This application claims the benefit of U.S. Provisional Application Ser. No. 60/425,599, "Method and Structures for Enhanced Temperature Control of High Power Components on Multilayer LTCC and LTCC-M Boards", filed Nov. 12, 2002, and is a continuation-in-part of U.S. application Ser. No. 10/199,418 filed by the present inventors on Jul. 19, 2002 now U.S. Pat. No. 6,713,862 and entitled "Low Temperature Co-Fired Ceramic-Metal Packaging Technology". U.S. application Ser. No. 10/199,418 is in turn a continuation-in-part of U.S. application Ser. No. 09/664,599, filed Sep. 18, 2000 (now U.S. Pat. No. 6,455,930), and also claims the benefit of four U.S. Provisional Applications: Ser. No. 60/170,417 filed Dec. 13, 1999, Ser. No. 60/206,519 filed May 22, 2000, Ser. No. 60/206,170 filed May 22, 2000, and Ser. No. 60/213,098 filed Jun. 21, 2000. The U.S. Pat. No. 6,455,930, U.S. application Ser. No. 10/199,418, U.S. application Ser. No. 09/664,599, and each of the provisional applications 60/425,599, 60/170,417, 60/206,519, 60/206,170, and 60/213,098 are all incorporated herein by reference.

FIELD OF THE INVENTION

This invention relates to a method and structure for enhanced temperature control of power components mounted in or on multilayer ceramic circuit boards. More particularly it relates to a method and structure for forming or mounting high power components on low temperature co-fired ceramic circuit boards (LTCC boards) or on LTCC metal boards (LTCC-M boards).

BACKGROUND OF THE INVENTION

Multilayer ceramic circuit boards are made from layers of green ceramic tapes. A green tape is made from particular glass compositions and optional ceramic powders which are mixed with organic binders and a solvent, cast and cut to form the tape. Wiring patterns can be screen printed onto the tape layers to carry out various functions. Vias are then punched in the tape and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably from about 750–950° C. The composition of the glasses determines the coefficient of thermal expansion, the dielectric constant and the compatibility of the multilayer ceramic circuit boards to various electronic components.

More recently, metal support substrates (metal boards) have been used to support the green tapes. The metal boards lend strength to the glass layers. Moreover since the green tape layers can be mounted on both sides of a metal board and can be adhered to a metal board with suitable bonding glasses, the metal boards permit increased complexity and density of circuits and devices. In addition, passive and active components, such as resistors, inductors, capacitors and the like, can be incorporated into the circuit boards for additional functionality. Thus this system, known as low temperature cofired ceramic-metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of an LTCC-M structure must be matched to the thermal coefficient of expansion of the metal support board. Glass ceramic compositions are known that match the thermal expansion properties of various metal or metal matrix composites. These compositions are disclosed for example in U.S. Pat. No. 5,625,808 to Tormey et al; U.S. Pat. No. 6,017,642 to Kumar et al; U.S. Pat. No. 5,256,469 to Cherukuri et al; and U.S. Pat. No. 5,565,262 to Azzaro et al. U.S. Pat. No. 5,581,876 to Prabhu et al. disclose bonding glass compositions for adhering ceramic layers to metal support substrates. These composition patents are incorporated herein by reference.

While conventional LTCC and LTCC-M boards provide superior temperature control and heat dissipation adequate for most common circuit components, they may not offer sufficient power dissipation for all forms of high power components such as high power resistors. For example, the boards do not permit the printing of typical high power resistors on the board surface. Rather, they require the use of surface mount chip power resistors at greater expense and complexity of fabrication. Accordingly, it would be desirable to provide a method and structure for enhanced temperature control of multilayer LTCC and LTCC-M boards.

SUMMARY OF THE INVENTION

A multilayer ceramic circuit board comprises a core of high conductivity material such as metal and an overlying layer of electrically insulating ceramic having an outer surface. In accordance with the invention, a circuit board for receiving a high power component is provided with a thermal spreading layer on or near the outer surface and one or more thermal vias through the ceramic to thermally couple the spreading layer to the core. The vias and the spreading layer comprise electrically insulating thermally conductive materials. The resulting structure provides rapid heat dissipation for a high power component formed or mounted on or near the spreading layer.

BRIEF DESCRIPTION OF THE DRAWINGS

The advantages, nature and various additional features of the invention will appear more fully upon consideration of the illustrative embodiments now to be described in connection with the accompanying drawings. In the drawings.

It is to be understood that these drawings are for illustrating the concepts of the invention and are not to scale.

DETAILED DESCRIPTION

Figure 1:
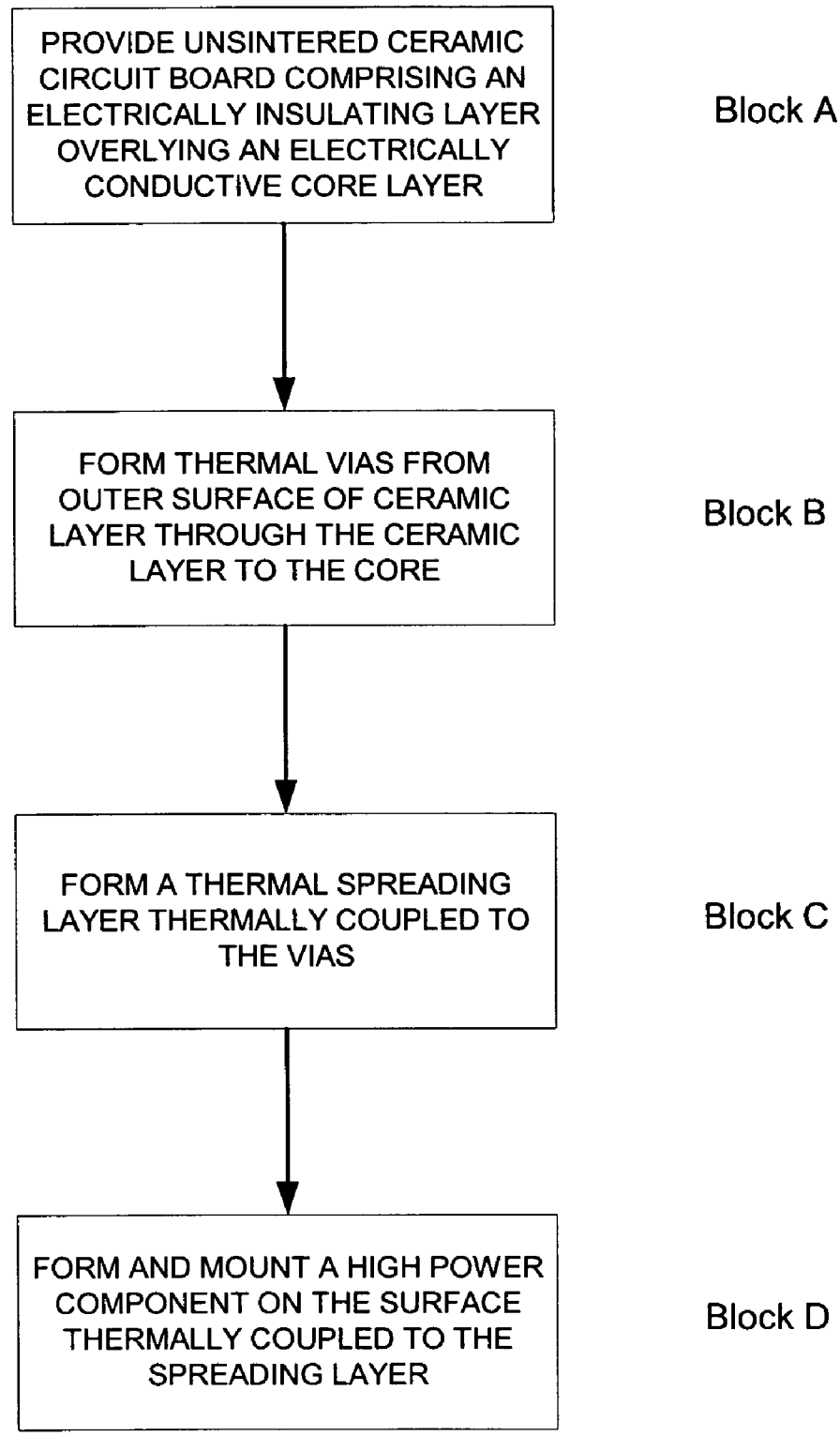
FIG. 1 is a flow diagram of the steps in a method for providing a multilayer ceramic circuit board device with enhanced temperature control.

Referring to the drawings, FIG. 1 is a schematic block diagram of the steps involved in providing a multilayer ceramic circuit board device with enhanced temperature control. The first step, shown in Block A, is to provide an unsintered multilayer ceramic circuit board comprising an electrically conductive core layer and, overlying the core layer, an electrically insulating ceramic layer having an outer surface. The unsintered circuit board can be an LTCC or LTCC-M ceramic formed using green tape technology. It can be formed by applying to the core green ceramic tapes comprised of glass an glass ceramic materials which densify at about 800–950° C. The core can be metal such as Kovar, copper, or molybenum-copper.

The next step, shown in Block B, is to form one or more thermal vias extending from the outer surface through the ceramic layer to the core. The via holes are typically formed by punching holes in the green ceramic tape, and the holes are filled, as by screen printing, with a screen printable ink for forming high thermal conductivity, electrically insulating material. The term thermally conductive material as used herein refers to a material such as Aluminum Nitride (AlN) having a thermal conductivity in excess of 40 Watt/m° K. The ink can comprise powders of thermally conductive materials such as diamond, aluminum nitride (AlN), beryllium oxide (BeO), or silicon carbide (SiC), or fibers/whiskers made from SiC or carbon. It can also include glass or glass-forming powders such as, PbO and/or $Bi_2O_3$ or other low melting oxides which densify in the 800–950 C. range. The mixture of powders is chosen to match the firing shrinkage and thermal coefficient of expansion (TCE) of the multilayer ceramic. Advantageous ink mixtures comprise 30–70 volume percent of the high conductivity material and the balance of glass and low melt oxides.

As an alternative to vitreous glass materials, one can use crystallizing materials which first densify by viscous flow and then crystallize later in the firing cycle. The use of crystallizing glasses in the via ink has an added advantage of further enhancing conductivity since crystalline ceramics generally have higher conductivity than vitreous ones.

The third step (Block C) is to form a thermal spreading layer on the surface thermally coupled to the filled thermal vias. This step can be effected by screen printing a thin layer of electrical insulating, high thermal conductivity ink on the surface. The ink for the thermal spreading layer can be composed of the same or similar material used to fill the vias but advantageously has a lower viscosity.

The next step shown in Block D is to form or mount a high power component thermally coupled to the spreading layer. The term high power component, as used herein, refers to a component such as a power resistor, or power semiconductor that has a power dissipation in excess of 20 W. For example, after printing any necessary conductive ink connecting layers, a high power resistor can be screen printed of resistive ink between connecting layers and overlying or adjacent to the spreading layer. The structure is then densified and fired in accordance with techniques well known in the art.

Figure 2:
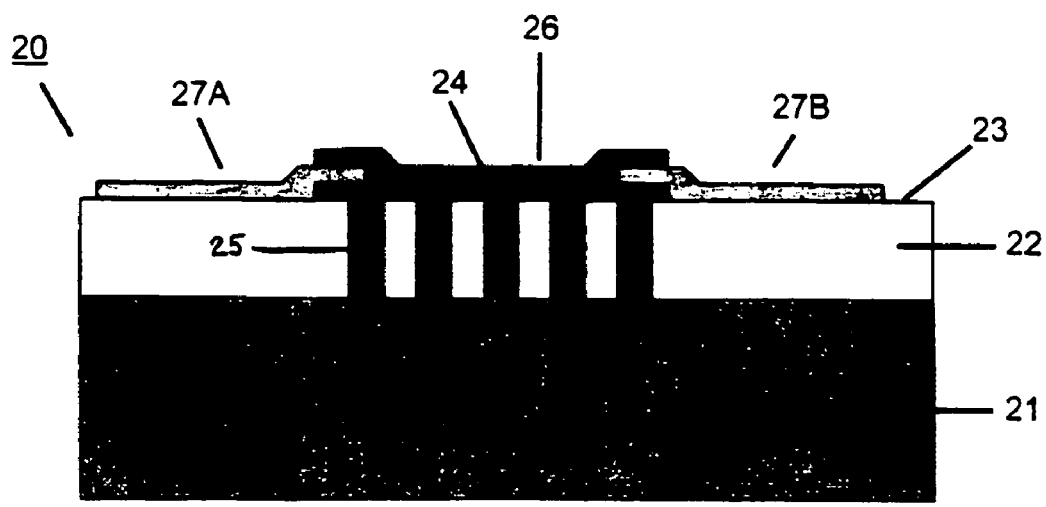
FIG. 2 is a schematic cross section of an exemplary device made by the process of FIG. 1.

FIG. 2 is a schematic cross section of an exemplary device fabricated in accordance with the methods of FIG. 1. The multilayer ceramic board device 20 comprises a metal core support board 21 supporting an overlying ceramic layer 22 having an outer surface 23. A thermal spreading layer 24 is disposed on or near the surface 23, and a plurality of filled vias 25 extend from the surface 23 through the ceramic layer 22 to the metal core 21. The vias 25 are thermally coupled to a thermal spreading layer 24 on the surface 23 as by physical contact. A high power component 26, such as a resistor, is thermally coupled to the spreading layer 24. The high power component 26 can extend between metal leads 27A, 27B.

Figure 3:
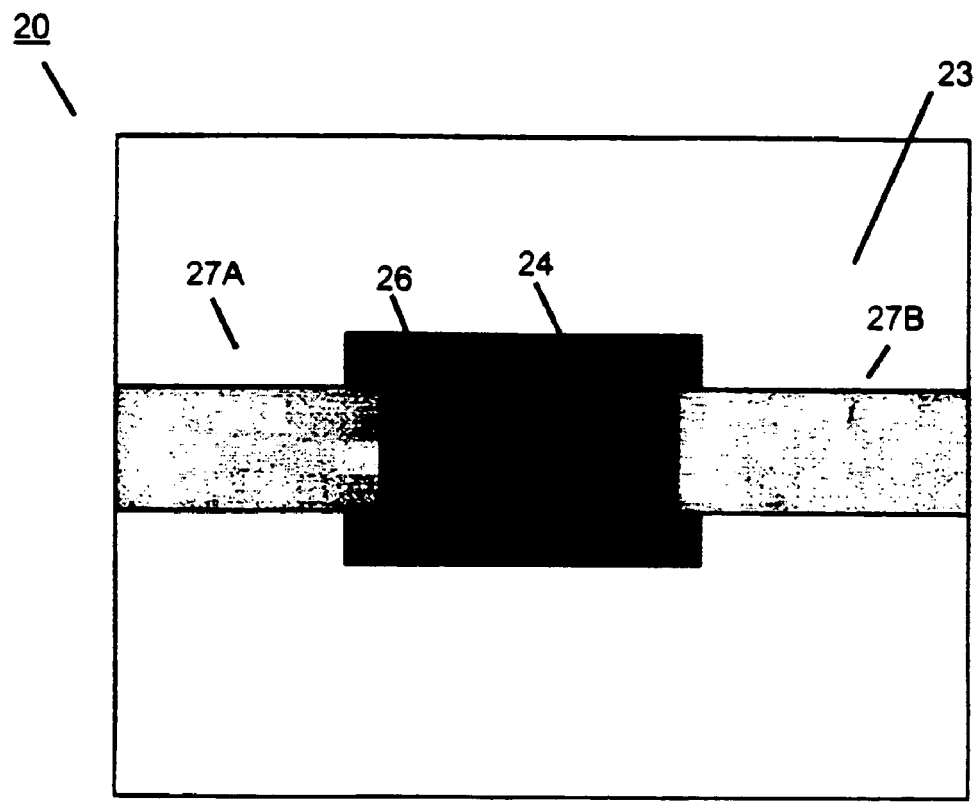
FIG. 3 is a top view of an advantageous form of the FIG. 1 device.

FIG. 3 is a top view of an advantageous form of the FIG. 2 device. Here a high power resistor 26 extends between leads 27A, 27B adjacent spreading layer 24.

The use of crystallizing glasses in the thermal via compositions have an added advantage in that they can further enhance the thermal conductivity of the resultant via, since crystalline ceramics have higher conductivities than do non-crystalline (glassy) ones. The same or similar compositions as those used in the via ink can be used to fabricate a screen printable glaze ink (lower viscosity than via ink but with same inorganic composition) applied as a thin layer on the surface of the green tape, thereby connecting the thermal vias (as shown in FIGS. 1 and 2) in the x, y plane and further enhancing heat spreading/dissipation directly under the hot device.

Suitable glass compositions for the thermal vias are those with the same or similar compositions to the glass materials used to form the LTCC green tape, and may include Zn—Mg-borosilicates, Zn—Mg—Al-borosilicates, Mg—Al-borosilicates, Pb—Zn—Al-silicates, Ca—Al-borosilicates and Pb—Al-silicates (such as those disclosed in U.S. Pat. Nos. 5,625,808 and 6,017,642 for LTCC cofired on metal support substrates such as Kovar and Copper-Molybdenum-Copper). In LTCC-M systems, use of thermal vias have an added advantage (over those in stand alone LTCC) in that they can connect directly to an integral high conductivity metal core, which further aids in heat dissipation.

In many cases the heat generating surface of a power component, such as a power resistor, can not have it's heat exchanging surface electrically connected to a heat sink. In the case of a power component, multiple electrically conductive vias used for heat exchange would short the resistor. Thus, the dielectric nature of the vias is crucial in most applications regarding heat flow from deposited, or film integrated components to a conductive core heat sink.

The invention can now be more clearly understood by consideration of the following specific example.

EXAMPLE

For example, thermally conductive vias may be formed from an ink comprised 50 vol % diamond powder (such as that sold by GE Micron Products with the name SJK-5 with a 4–8 micron particle size or another material with high thermal conductivity such as SiC whiskers, AlN powder, carbon fibers, etc.) and 50% glass powder (KU-8 glass for the Cu-Moly-Cu system; HEG-12 glass for the Kovar system) making up the inorganic portion, which is combined with an organic vehicle and mixed as on a 3-roll mill to form a homogenous mixture which is screen printable. Such an ink can be used to fill punched via holes in the LTCC tape layers by screen printing it through a metal stencil. A number of such via filled tape layers can then be stacked and laminated together to form a laminate whereby the vias are stacked on top of each other thereby providing a direct thermal path from the top of the stack to the metal core, to which the laminate is attached. An ink of the same inorganic composition but with a lower solids content can be used to print a pad on the top tape layer which ties the vias together and acts as a heat spreader on the top surface.

Glass Compositions:

| Component | Composition (weight %) | |
|---|---|---|
| | KU-8 Glass | HEG-12 Glass |
| MgO | | |
| $Al_2O_3$ | 20.0 | 10.0 |
| CaO | 26.0 | |
| $SiO_2$ | 50.0 | 38.0 |
| $B_2O_3$ | | |
| $P_2O_5$ | 1.50 | |
| PbO | | 42.0 |
| ZnO | | 10.0 |
| $ZrO_2$ | 2.50 | |

It can now be seen that the invention includes a method for making a multilayer ceramic circuit board having enhanced heat dissipation for a power component comprising the steps of providing an unsintered multilayer ceramic circuit board comprising an electrically conductive core layer, an overlying the core layer, and an electrically insulating ceramic layer having an outer surface. One or more thermal vias are formed extending from the outer surface through the ceramic layer to the core layer; and a thermal spreading layer if formed on the surface thermally coupled to the thermal vias. The power component is formed or mounted thermally coupled to the spreading layer, whereby heat from the power component passes through the spreading layer to the vias and then to the core layer.

The unsintered circuit board can comprise an LTCC or LTCC-M ceramic board. And, the core can comprise Kovar, copper, or molybdenum. Thermal vias may be formed by forming holes in the ceramic layer and filling the holes with ink for forming a thermally conductive, electrically insulating material. The thermal spreading layer can be formed by applying a layer of electrically insulating, thermally conductive ink to the surface.

The invention also provides a low temperature cofired ceramic-metal (LTCC-M) integrated package comprising a metal core support board; a ceramic layer disposed on the metal core support board, the ceramic layer having an outer surface; and a thermal spreading layer disposed on the outer surface of the ceramic layer. One or more thermally conductive vias are thermally coupling the thermal spreading layer to the metal core support board. The vias control the temperature of a power component disposed on or near the thermal spreading layer. The power component can be a resistor. The resistor can be formed by printing a resistive ink between connecting layers overlying or adjacent to the spreading layer.

The power component can be a resistor or a power semiconductor. The core can comprise Kovar, copper or molybdenum. The thermally conductive vias comprise a sintered printable ink. The printable ink can comprise a material selected from the group consisting of diamond, aluminum nitride, beryllium oxide, and silicon carbide. The ceramic layer can be a plurality of ceramic circuit boards, at least one ceramic circuit board comprising electrical components and conductive traces.

It is understood that the above-described embodiments are illustrative of only a few of the many possible specific embodiments, which can represent applications of the invention. Numerous and varied other arrangements can be made by those skilled in the art without departing from the spirit and scope of the invention.

We claim:

1. A low temperature cofired ceramic-metal (LTCC-M) integrated package comprising:
    a metal core support board;
    a ceramic layer disposed on the metal core support board, the ceramic layer having an outer surface;
    a thermal spreading layer of thermally conductive material disposed on the outer surface of the ceramic layer;
    one or more thermally conductive vias thermally coupling the thermal spreading layer to the metal core support board;
    a power component disposed on the thermal spreading layer, the component having conductive leads for connecting it to a circuit.

2. The LTCC-M package of claim 1 wherein the power component is a resistor.

3. The LTCC-M package of claim 1 wherein the power component is a power semiconductor.

4. The LTCC-M package of claim 1, wherein the core comprises Kovar, copper or molybdenum.

5. The LTCC-M package of claim 1 wherein the thermally conductive vias comprise a sintered printable ink.

6. The LTCC-M package of claim 5 wherein the printable ink comprises a material selected from the group consisting of diamond, aluminum nitride, beryllium oxide, and silicon carbide.

7. The LTCC-M package of claim 1 wherein the ceramic layer comprises a plurality of ceramic circuit boards, at least one ceramic circuit board comprising electrical components and conductive traces.

8. The LTCC-M package of claim 7 wherein the power component is disposed on the thermal spreading layer disposed on one of the ceramic circuit boards, and the spreading layer is thermally connected to the metal core support board by the thermal conductive vias.

* * * * *